United States Patent
Bayadroun

(10) Patent No.: US 7,535,265 B2
(45) Date of Patent: May 19, 2009

(54) HIGH ACCURACY ZERO CROSSING DETECTOR AND METHOD THEREFOR

(75) Inventor: Abdesselam Bayadroun, Tournefeuille (FR)

(73) Assignee: Semiconductor Components Industries, L.L.C., Phoenix, AZ (US)

( * ) Notice: Subject to any disclaimer, the term of this patent is extended or adjusted under 35 U.S.C. 154(b) by 0 days.

(21) Appl. No.: 11/573,152

(22) PCT Filed: Oct. 20, 2004

(86) PCT No.: PCT/US2004/034507

§ 371 (c)(1),
(2), (4) Date: Feb. 2, 2007

(87) PCT Pub. No.: WO2006/043949

PCT Pub. Date: Apr. 27, 2006

(65) Prior Publication Data

US 2008/0164914 A1    Jul. 10, 2008

(51) Int. Cl.
*H03K 5/153* (2006.01)
(52) U.S. Cl. .............................. 327/79; 327/78; 327/87
(58) Field of Classification Search .................. 327/79, 327/307; 330/9
See application file for complete search history.

(56) References Cited

U.S. PATENT DOCUMENTS

| | | | | |
|---|---|---|---|---|
| 4,480,200 A | * | 10/1984 | Tan et al. ....................... | 327/79 |
| 4,578,646 A | * | 3/1986 | Maio et al. .................. | 327/307 |
| 4,808,942 A | * | 2/1989 | Milkovic ........................ | 330/9 |
| 5,001,364 A | * | 3/1991 | Petrie et al. .................... | 327/79 |

* cited by examiner

*Primary Examiner*—Long Nguyen
(74) *Attorney, Agent, or Firm*—Robert F. Hightower

(57) ABSTRACT

In one embodiment, a zero crossing detector couples a plurality of comparators in parallel and operates at least a portion of the comparators at different time periods.

19 Claims, 3 Drawing Sheets

HIGH ACCURACY ZERO CROSSING DETECTOR AND METHOD THEREFOR

BACKGROUND OF THE INVENTION

The present invention relates, in general, to electronics, and more particularly, to methods of forming semiconductor devices and structure.

In the past, power supply controllers often used zero crossing detectors to determine when current through an inductor of the power supply was reaching a zero crossing in order to control the power switches of the power system. Switching the power switches at the zero crossing improved the efficiency of the power supply controller. Typically, a comparator compared a current sense signal to a reference signal in order to determine when the current sense signal was approaching the zero crossing of the signal. However, the comparators had variations that limited the accuracy of the comparators and reduced the efficiency of the power supply system. The variations typically resulted from semiconductor processing variations and temperature variations. In battery-powered operations, the variations caused reduced power efficiency and reduced the length of time the equipment could be operated from the battery.

Accordingly, it is desirable to have a zero crossing detector that has improved accuracy and that more accurately detects the zero crossing of a sense signal.

For simplicity and clarity of illustration, elements in the figures are not necessarily to scale, and the same reference numbers in different figures denote the same elements. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or anode of a diode, and a control electrode means an element of the device that controls current through the device such as a gate of an MOS transistor or a base of a bipolar transistor.

DETAILED DESCRIPTION OF THE DRAWINGS

Figure 1:
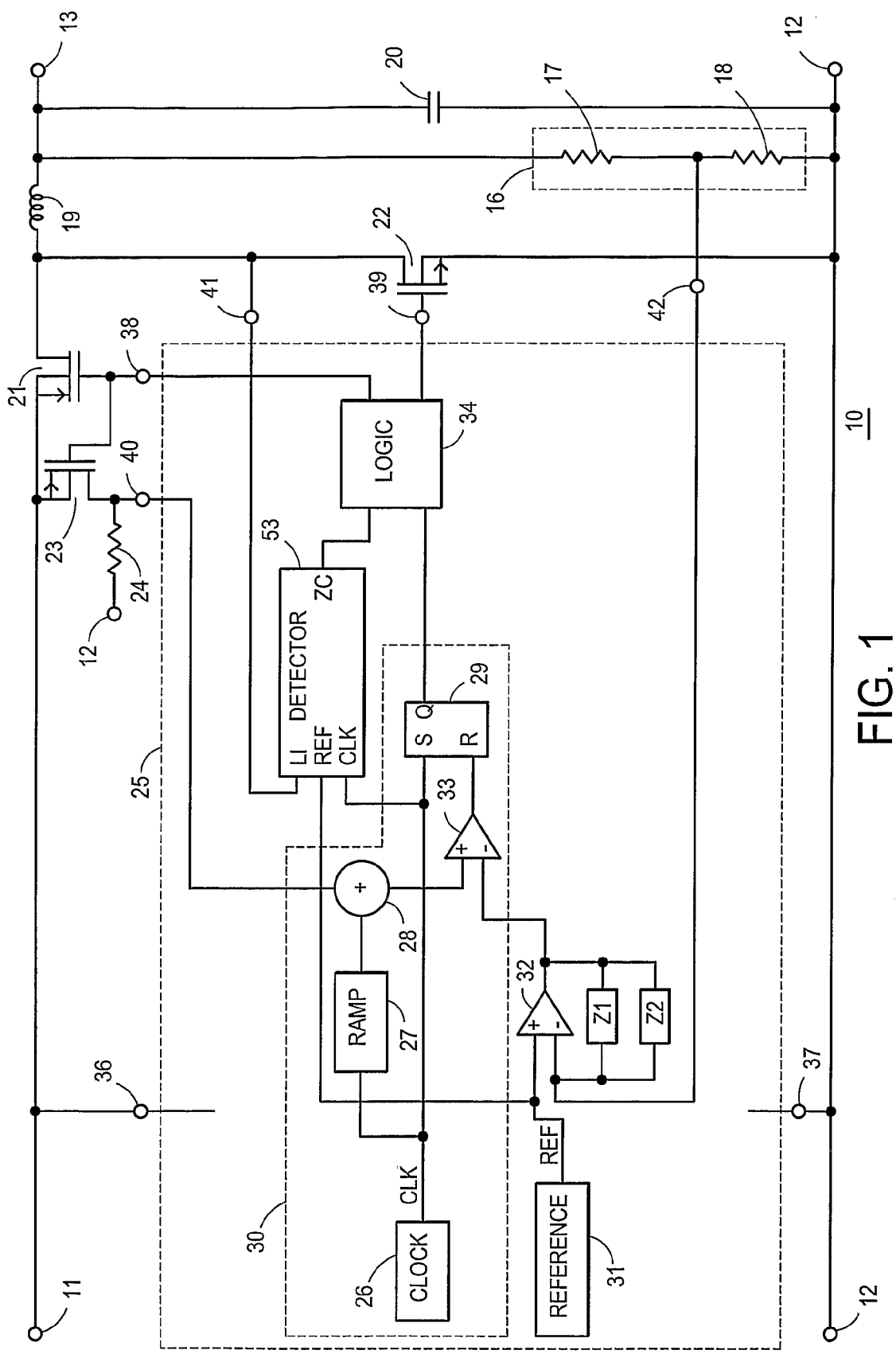
FIG. 1 schematically illustrates an embodiment of a portion of a power supply controller in accordance with the present invention.

FIG. 1 schematically illustrates a portion of an embodiment of a power supply system 10. System 10 includes a power supply controller 25 that accurately detects the zero crossing of current stored in an inductor 19 of system 10. System 10 receives power between a power input terminal 11 and a power return terminal 12 and responsively forms an output voltage between a voltage output terminal 13 and terminal 12. The voltage applied between terminals 11 and 12 typically is a dc voltage such as a battery voltage or a rectified ac voltage. A feedback network 16 is connected between terminals 13 and 12 and forms a feedback signal on an output of network 16. The feedback signal is representative of the value of the output voltage between terminals 13 and 12, and is received on a feedback input 42 of controller 25. In the preferred embodiment, network 16 includes a first feedback resistor 17 and a second feedback resistor 18 connected in series between terminals 13 and 12. System 10 also includes an energy storage capacitor 20 in addition to energy storage inductor 19. A first power switch or power transistor 21 is connected in series between terminal 11 and inductor 19 and a second power switch or power transistor 22 is connected between inductor 19 and terminal 12 and functions as a synchronous rectifier for system 10. A current sense transistor 23 is utilized to provide the current sense signal that is representative of the current flowing through transistor 21. In the preferred embodiment, transistor 23 is formed to have a size and operational characteristics that are ratioed to the size and characteristics of transistor 21 in order to mirror the current flowing through transistor 21. Such a transistor often is referred to as a ratioed transistor. In this preferred embodiment, transistor 21 is a P-channel power MOSFET and transistor 23 is a P-channel MOS transistor. In other embodiments, transistor 21 may be a sense FET or other similar transistor that includes the functionality of transistor 23. A current sense resistor 24 is coupled to transistor 23 to translate the current through transistor 23 into a voltage that forms the current sense signal. Inductor 19 and capacitor 20 typically are external to controller 25. Network 16, resistor 24, and transistors 21, 22, and 23 are illustrated externally to controller 25; however, in some embodiments network 16 or transistors 21, 22, and 23 may be included within controller 25.

Power supply controller 25 receives power between a voltage input 36 and a voltage return 37. Typically, input 36 is connected to terminal 11 and return 37 is connected to terminal 12. Power supply controller 25 includes a reference generator or reference 31, an error amplifier 32, a zero crossing detector or detector 53, and a PWM control channel 30. In some embodiments, controller 25 may also include an internal regulator that receives the voltage from input 36 and provides an internal operating voltage for operating the elements of controller 25. Zero crossing detector or detector 53 is configured to generate a zero crossing signal (ZC) that indicates the zero crossing of the current through inductor 19. The zero crossing signal (ZC) assists in controlling transistor 22. PWM control channel 30 forms a PWM control signal that is utilized for controlling transistor 21. Controller 25 also typically includes a logic block or logic 34. Logic 34 receives the PWM control signal and the zero crossing signal and forms a first control signal that is used to control transistor 21 in response to the PWM control signal from channel 30. Logic 34 also generates a second control signal that is used to enable transistor 22 after transistor 21 is disabled and used to disable transistor 22 responsively to the ZC signal. Such logic and functionality are well known to those skilled in the art.

Reference 31 of channel 30 forms a reference signal (Ref) that is used by error amplifier 32. Amplifier 32 receives the reference signal (Ref) and the feedback signal from input 42 and responsively generates the error signal. Typically, amplifier 32 has a gain control and frequency compensation network that is represented in a general manner by elements Z1 and Z2. Such error amplifiers and gain control and frequency compensation networks are well known by those skilled in the art. Channel 30 includes a system clock or clock 26 that generates a system clock signal (CLK) that is used for operating PWM control channel 30. Channel 30 also includes a ramp generator or ramp 27, a PWM comparator 33, a PWM latch 29, and an adder 28. The system clock signal (CLK) is used to set latch 29 and initiate a PWM control cycle. Ramp 27 receives CLK and generates a ramp signal that is received by adder 28. Adder 28 also receives the current sense signal from a current sense input 40 of controller 25, adds the current sense signal to the ramp signal, and generates an output that is received by PWM comparator 33. Comparator 33 also receives the error signal from amplifier 32. When the error signal from amplifier 32 is greater than the value of the output of adder 28, comparator 33 resets latch 29 to terminate the PWM control cycle. Such PWM control channels are well known by those skilled in the art.

Zero crossing detector 53 receives the reference signal (Ref) from reference 31, the CLK signal from clock 26, and an inductor current sense signal (LI) that is representative of the current through inductor 19. The value of the voltage across transistor 22 typically is used to form LI. Controller 25 receives the inductor current sense signal (LI) on an input 41. Detector 53 provides a zero crossing (ZC) signal that switches to an active state when detector 53 detects the zero crossing of the inductor current sense signal (LI). The zero crossing is an indication of a change in the direction of the inductor current and is used to determine the appropriate time to disable transistor 22. Accurately determining the zero crossing facilitates disabling transistor 22 at a time that improves the efficiency of controller 25 and system 10.

Figure 2:
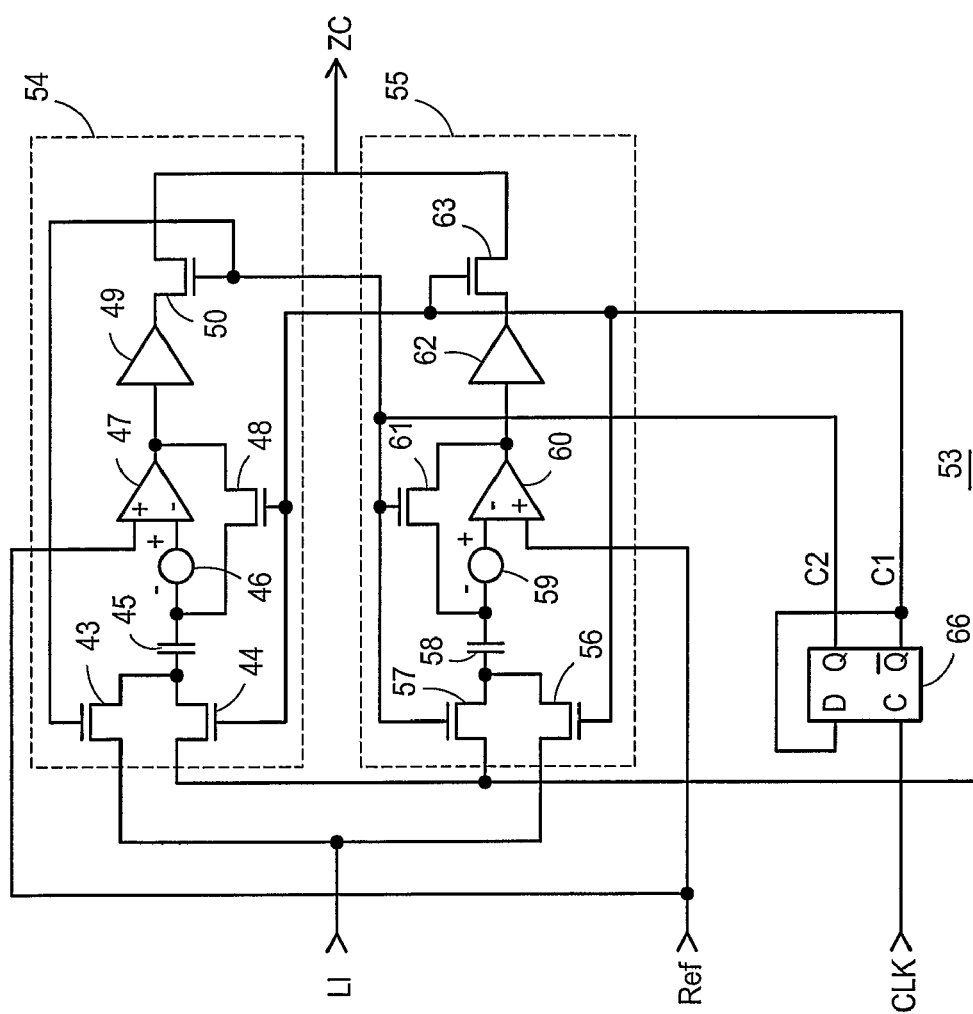
FIG. 2 schematically illustrates an embodiment of a portion of a zero crossing detector in accordance with the present invention.

FIG. 2 schematically illustrates an embodiment of a portion of the circuitry of detector 53. Detector 53 includes a first comparator channel 54 that has a first comparator 47 and a second comparator channel 55 that has a second comparator 60. Channels 54 and 55 are configured to cancel the offset voltages of comparators 47 and 60 in order to improve the accuracy of detecting the zero crossing of the inductor sense signal. As will be seen further hereinafter, channels 54 and 55 couple comparators 47 and 60 in parallel and operate comparators 47 and 60 during different time periods in order to form the ZC signal. During one time period, the offset voltage of comparator 47 is stored on a first storage element 45 and during a second time period LI is applied to first storage element 45 so that the differential signal received by comparator 47 is the value of LI minus the offset of comparator 47. Consequently, the offset voltage that was stored on element 45 during the first time period subtracts from the value stored on element 45 during the second time period thereby canceling the offset voltage. Consequently, comparator 47 accurately compares LI to a second reference. Typically the value of this second reference is ground. Channel 55 functions similarly to channel 54 but at different time periods. The different time periods are formed by a D type flip-flop 66. Flip-flop 66 receives the system clock signal (CLK) and generates two clock phases (C1 and C2) that are utilized for operating channels 54 and 55.

Channel 54 includes an input transistor or input switch 43 that is coupled in parallel with a common transistor or common switch 44, storage element 45, a feedback transistor or feedback switch 48, an output buffer 49, and an output transistor or output switch 50. A voltage source 46 represents the input offset voltage of comparator 47. Channel 55 similarly includes an input transistor or input switch 56 that is coupled in parallel with a common transistor or common switch 57, storage element 58, a feedback transistor or feedback switch 61, an output buffer 62, and an output transistor or output switch 63. A voltage source 59 represents the input offset voltage of comparator 60.

When phase C1 becomes active, switch 44 couples one terminal of element 45 to return 37 as the second reference to form a reference voltage for that side of the storage element. Switch 48 couples the output of comparator 47 to the input of comparator 47 and to a second terminal of element 45. Clock phase C2 is inactive, thus, switches 43 and 50 are open. Closing switch 48 connects comparator 47 as an amplifier with unity gain, thus, the output is approximately equal to the inputs. Thus, the output of comparator 47 is equal to Ref minus the offsets of comparator 47, as is shown in the equations below. Consequently, element 45 stores a value that is the value of Ref minus the value of the offset voltage of comparator 47 (represented by source 46). The value stored on element 45 is illustrated by:

$$V45=(Vref-(V37+V46))$$

Since V37 typically is ground, $$V45=(Vref-V46)$$

Where;
V45—the voltage stored on element 45,
V37—the voltage on return 37;
V46—the offset voltage of comparator 47, and
Vref—the value of the reference signal Ref.

Subsequently, phase C1 becomes inactive and phase C2 becomes active. Phase C1 being inactive opens switches 44 and 48. Phase C2 being active closes switches 43 and 50. Opening switch 48 once again couples comparator 47 to function as a comparator. Switch 43 couples LI to the first terminal of storage element 45 thereby applying a signal to the inverting input of comparator 47 that is y equal to the LI plus the offset voltage of source 46 plus the voltage stored on element 45. Consequently, the offset voltage of comparator is negated by the value stored on element 45 thereby improving the accuracy of comparator 47 as seen by the following equations:

$$V47=(LI+V45+V46)-Vref$$

substituting V45 from above gives $$V47=LI+Vref-(V37+V46)+V46-Vref=LI-V37$$

Since V37 typically is ground, $$V47=LI$$

Where;
V47—the input voltage between the inverting and non-inverting inputs of comparator 47;
LI—the sense signal on input 41
V45—the voltage stored on element 45,
V37—the voltage on return 37;
V46—the offset voltage of comparator 47, and
Vref—the value of the reference signal Ref.

Since V37 is typically a common voltage, such as ground, the input typically is substantially LI. It can be seen by the equation that this method minimizes the effect of the offset voltages of comparator 47. When the inductor current sense signal (LI) is less than the second reference V37 the output of comparator 47 goes high forcing the output of buffer 49 high thereby forcing the zero crossing signal (ZC) high. Buffer 49 buffers the output of comparator 47 and switch 48 from the output of detector 53. Switch 50 allows data transmission from channel 54 to the output to form a portion of the signal ZC.

Channel 55 functions similarly to channel 54 but is out of phase with channel 54. Phase C2 being active, closes switches 57 and 61 thereby coupling the output of comparator 60 to the input and to element 58. Phase C1 is inactive, thus switches 56 and 63 are open. The output of comparator 60 is approximately equal to Ref minus the offsets of comparator 60. Consequently, element 58 stores a value that is the value of Ref minus the value of the offset of comparator 60 (represented by source 59). When phase C2 is inactive and phase C1 is active, switches 57 and 61 are open and switches 56 and 63 are closed thereby coupling the value of the sense signal (LI) to element 58 and to comparator 60. Similarly to comparator 47, comparator 60 receives a signal at the inverting input that is substantially LI plus the offset voltage of source 59 plus the voltage stored on element 58. When this value is less than the value of the reference signal Vref, the output of comparator 60 becomes active forcing the output of buffer 62 high and forcing the zero detect signal high. Switch 63 allows data transmission from channel 55 to the output to form a portion of the signal ZC.

Operating a plurality of comparators in parallel at different time periods allows storing the offset voltage on the storage element of one comparator channel while the other comparator channel is comparing the inductor current sense signal to the reference voltage. Thus, operating a plurality of comparator channels in parallel with a number of clock phases that is equal to the number of comparator channels improves the accuracy of the detection of the zero crossing thereby improving the efficiency of controller 25 and system 10. Detector 53 results in controller 25 having an efficiency that is about ten to twenty percent better than the efficiency of prior art controllers. From the prior description, it can be seen that detector 53 receives the inductor current sense signal, stores a value from an output of comparator 47 on storage element 45 during a first time period, couples the inductor current sense signal to storage element 45 during a second time period, stores a value of an output of comparator 60 on storage element 58 during the second time period, and couples the inductor current sense signal to storage element 58 during the first time period.

In order to provide the functionality of controller 25, input 36 of controller 25 is connected to terminal 11 and to a drain of transistor 21. A source of transistor 21 is commonly connected to a first terminal of inductor 19, input 41 of controller 25, and a drain of transistor 22. A source of transistor 22 is connected to terminal 12. A second terminal of inductor 19 is commonly connected to terminal 13, a first terminal of capacitor 20, and a first terminal of resistor 17. A second terminal of capacitor 20 is connected to terminal 12. A second terminal of resistor 17 is connected to a first terminal of resistor 18 and to input 42 of controller 25. A second terminal of resistor 18 is connected to terminal 12. Return 37 of controller 25 is connected to terminal 12. An output of clock 26 is commonly connected to an input of ramp 27, a set input of latch 29, and a CLK input of detector 53. An output of ramp 27 is connected to a first input of adder 28. Input 40 of controller 25 is connected to a second input of adder 28 which has an output connected to a non-inverting input of comparator 33. An output of comparator 33 is connected to a reset input of latch 29. An inverting input of comparator 33 is connected to an output of amplifier 32 and to a first terminal of impedances Z1 and Z2. An inverting input of, amplifier 32 is connected to a second terminal of impedances Z1 and Z2 and to input 42 of controller 25. A non-inverting input of amplifier 32 is connected to an output of reference 31 and to a Ref input of detector 53. A Q output of latch 29 is connected to a first input of logic 34 and the ZC output of detector 53 is connected to a second input of logic 34. A first output of logic 34 is connected to output 38 of controller 25 and to a gate of transistor 21. A second output of logic 34 is connected to output 39 of controller 25 and a gate of transistor 22. An LI input of detector 53 is commonly connected to a source of transistor 43 and a source of transistor 56. A drain of transistor 43 is connected to a drain of transistor 44 and a first terminal of element 45. A second terminal of element 45 is connected to a source of transistor 48. Since source 46 is not an element but is merely a representation on the input offset voltage of comparator 47, the second terminal of element 45 is also connected to an inverting input of comparator 47. A drain of transistor 48 is connected to an output of comparator 47 and an input of buffer 49. A non-inverting input of comparator 47 is commonly connected to a non-inverting input of comparator 60 and the Ref input of detector 53. An output of buffer 49 is connected to a source of transistor 50 which has a drain commonly connected to the output of detector 53 and a drain of transistor 63. A source of transistor 63 is connected to the output of buffer 62 which has an input connected to the output of comparator 60 and to a drain of transistor 61. A source of transistor 61 is connected to a first terminal of element 58. Since source 59 is not an element but is merely a representation on the input offset voltage of comparator 60, the first terminal of element 58 is also connected to an inverting input of comparator 60. A second terminal of element 58 is commonly connected to a drain of transistor 57 and a drain of transistor 56. A source of transistor 57 is commonly connected to return 37 and to a source of transistor 44. A gate of transistors 43, 50, 61, and 57 are commonly connected to a Q output of flip-flop 66. A gate of transistors 44, 48, 63, and 56 is commonly connected to a Q bar output of flip-flop 66 and a D input of flip-flop 66. A clock input of flip-flop 66 is connected to the system clock signal (CLK).

Figure 3:
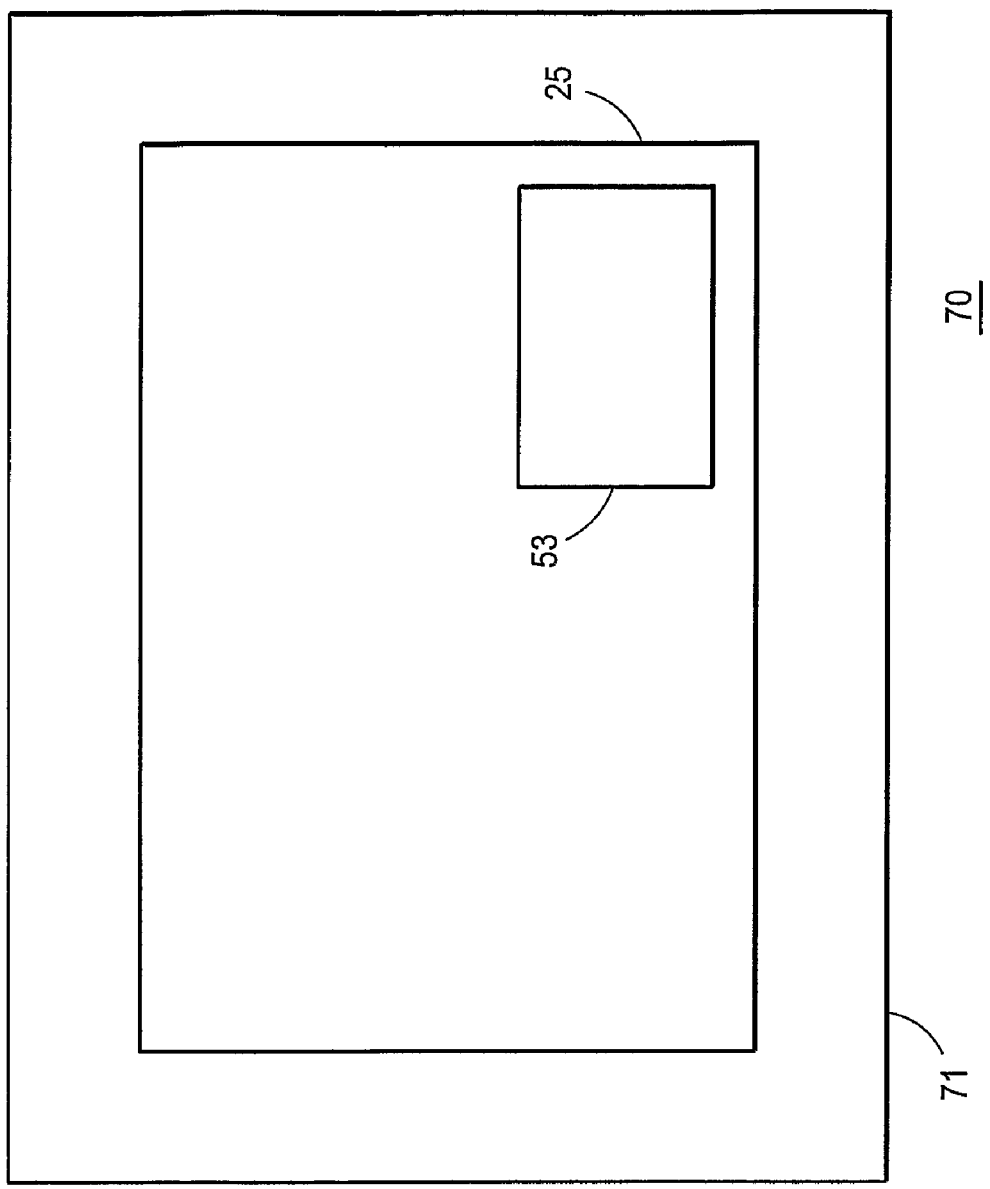
FIG. 3 schematically illustrates an enlarged plan view of a semiconductor device on which the zero crossing detector of FIG. 2 is formed in accordance with the present invention.

FIG. 3 schematically illustrates an enlarged plan view of a portion of an embodiment of a semiconductor device 70 that is formed on a semiconductor die 71. Controller 25 including detector 53 are formed on die 71. Die 71 may also include other circuits that are not shown in FIG. 3 for simplicity of the drawing. Controller 25 and device 70 are formed on die 71 by semiconductor manufacturing techniques that are well known to those skilled in the art.

While the invention is described with specific preferred embodiments, it is evident that many alternatives and variations will be apparent to those skilled in the semiconductor arts. For example, controller 25 is illustrated operating as a buck controller but may also be used in a boost controller. Two comparator channels are illustrated but any number of parallel channels with a similar number of clock phases may be used. Additionally, the word "connected" is used throughout for clarity of the description, however, it is intended to have the same meaning as the word "coupled". Accordingly, "connected" should be interpreted as including either a direct connection or an indirect connection.

The invention claimed is:

1. A zero crossing detection method comprising:
receiving a sense signal;
coupling a first comparator as a first amplifier, and storing an output of the first amplifier on a first storage element during at least a portion of a first time period;
coupling the first comparator as a comparator and coupling the sense signal to the first storage element during at least a portion of a second time period;
coupling a second comparator as a second amplifier, and storing an output of the second amplifier on a second storage element during the portion of the second time period; and
coupling the second comparator as a comparator and coupling the sense signal to the second storage element during the first time period.

2. The method of claim 1 wherein storing the output of the first amplifier on the first storage element during at least the portion of the first time period includes coupling a first input of the first amplifier to receive a first reference signal, coupling a first terminal of the first storage element to a second reference, and coupling the output of the first amplifier to a second terminal of the first storage element and to a second input of the first amplifier.

3. The method of claim 1 wherein storing the output of the second amplifier on the second storage element during the portion of the second time period includes coupling a first input of the second amplifier to a first reference signal, coupling a first terminal of the second storage element to a second reference, and coupling the output of the second amplifier to a second terminal of the second storage element and to a second input of the second amplifier.

4. The method of claim 1 further including coupling an output of the first comparator to a first node during the second time period and coupling an output of the second comparator to the first node during the first time period.

5. A method of forming a power supply controller comprising:
configuring the power supply controller to receive a sense signal representative of a current through an inductor;
coupling a plurality of comparators in parallel with each comparator coupled to receive the sense signal including coupling a capacitor in series with an input of each comparator of the plurality of comparators;
configuring a first comparator of the plurality of comparators to store an offset of the first comparator on a first capacitor as a first stored value during at least a first portion of a first time period; and
configuring a second comparator of the plurality of comparators to store an offset of the second comparator on a second capacitor as a second stored value during at least a first portion of a second time period.

6. The method of claim 5 further including configuring a clock circuit to generate a plurality of slave clock signals wherein a first slave clock signal forms the first time period and a second slave clock signal forms the second time period.

7. The method of claim 6 further including configuring the clock circuit to form the second slave clock signal out of phase with the first slave clock signal.

8. The method of claim 6 wherein configuring the clock circuit to generate the plurality of slave clock signals includes configuring the power supply controller to form a system clock having a first period and to use the system clock for operating a PWM channel of the power supply controller, for forming the first slave clock signal, and for forming the second first slave clock signal.

9. The method of claim 5 further including coupling an output of the first comparator and an output of the second comparator to a common node to form a signal representative of a zero crossing of the sense signal.

10. The method of claim 9 wherein coupling the output of the first comparator and the output of the second comparator to the common node includes configuring the power supply controller to couple the output of the first comparator to the common node during at least a second portion of the second time period and to couple the output of the second comparator to the common node during at least a second portion of the first time period.

11. The method of claim 5 wherein configuring the first comparator of the plurality of comparators to store the offset of the first comparator on the first capacitor as the first stored value during at least the first portion of the first time period includes configuring the first comparator to compare the sense signal to a reference signal during at least a second portion of the second time period.

12. The method of claim 5 wherein configuring the first comparator of the plurality of comparators to store the offset of the first comparator on the first capacitor as the first stored value during at least the first portion of the first time period includes coupling the first capacitor to receive a first reference signal and an output of the first comparator during at least the first portion of the first time period and store a difference between the first reference signal and the output as the first stored value.

13. The method of claim 5 wherein configuring the second comparator of the plurality of comparators to store the offset of the second comparator on the second capacitor as the second stored value during at least the first portion of the second time period includes configuring the second comparator to compare the sense signal to a reference signal during at least a second portion of the first time period.

14. The method of claim 5 wherein configuring the second comparator of the plurality of comparators to store the offset of the second comparator on the second capacitor as the second stored value during at least the first portion of the second time period includes coupling the second capacitor to receive a second reference signal and an output of the second comparator during at least the first portion of the second time period and store a difference between the second reference signal and the output as the second stored value.

15. A zero crossing detector comprising:
a plurality of comparators coupled in parallel with each comparator having a first input and a second input, and a capacitor coupled to the second input of the comparator; and
a first portion of the plurality of comparators configured as an amplifier to store an offset voltage of the amplifier as a first stored offset during at least a first portion of a first time period and the first portion of the plurality of comparators configured as a comparator to compare a sense signal plus the first stored offset to a first reference signal during at least a first portion of a second time period.

16. The zero crossing detector of claim 15 wherein the first portion of the plurality of comparators configured as the amplifier to store the offset voltage of the amplifier as the first stored offset during at least the first portion of the first time period and the first portion of the plurality of comparators configured as the comparator to compare the sense signal plus the first stored offset to the first reference signal during at least the first portion of the second time period includes a first comparator of the first portion of the plurality of comparators having the first input coupled to receive a first reference signal, and the second input coupled to receive a second reference signal and an output of the first comparator during at least the first portion of the first time period and to receive the sense signal during at least a first portion of the second time period.

17. The zero crossing detector of claim 16 further including a second portion of the plurality of comparators having the first input coupled to receive the first reference signal, and the second input coupled to receive the second reference signal and an output of the second comparator during a second portion of the second time period and to receive the sense signal during at least a second portion of the first time period.

18. The zero crossing detector of claim 17 further including a first switch configured to couple the output of the first comparator to a common node during at least the first portion of the second time period and a second switch configured to couple the output of the second comparator to the common node during at least the second portion of the first time period.

19. The zero crossing detector of claim 17 further including a clock generator configured to receive a system clock and to responsively form the first time period and the second time period.

* * * * *